United States Patent
Vs et al.

(10) Patent No.: US 11,422,586 B1
(45) Date of Patent: Aug. 23, 2022

(54) METHODS AND SYSTEMS FOR GENERATION OF BALANCED SECONDARY CLOCKS FROM ROOT CLOCK

(71) Applicant: Texas Instruments Incorporated, Dallas, TX (US)

(72) Inventors: Aswath Vs, Kannur (IN); Sundarrajan Rangachari, Tamil Nadu (IN); Sarma Sundareswara Gunturi, Bangalore (IN); Sanjay Pennam, Andrha Pradesh (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 17/488,559

(22) Filed: Sep. 29, 2021

(30) Foreign Application Priority Data

Feb. 24, 2021 (IN) .............................. 202141007690

(51) Int. Cl.
*G06F 1/08* (2006.01)
*G06F 1/10* (2006.01)

(52) U.S. Cl.
CPC . *G06F 1/08* (2013.01); *G06F 1/10* (2013.01)

(58) Field of Classification Search
CPC .................................................. G06F 1/06–10
See application file for complete search history.

(56) References Cited

U.S. PATENT DOCUMENTS

| 8,253,450 B2 * | 8/2012 | Shibayama | G06F 1/08 327/117 |
| 8,422,619 B2 * | 4/2013 | Shibayama | H03B 19/00 327/117 |
| 9,411,361 B2 * | 8/2016 | Balasubramanian | G06F 1/12 |
| 10,651,836 B1 * | 5/2020 | Kale | H03K 5/131 |
| 10,651,863 B1 * | 5/2020 | Rangachari | G06F 7/582 |
| 10,911,057 B2 * | 2/2021 | Gunturi | H03K 21/08 |

* cited by examiner

*Primary Examiner* — Patrick O Neill
(74) *Attorney, Agent, or Firm* — John R. Pessetto; Charles A. Brill; Frank D. Cimino

(57) ABSTRACT

A system for generating secondary clock signals from a primary clock signal includes a dithered clock divider which has a first input adapted to receive the primary clock signal and a second input adapted to receive a random division ratio. The dithered clock divider provides a dithered clock signal. The system includes a multi-phase clock generator which has a first input adapted to receive the primary clock signal, a second input adapted to receive the dithered clock signal, and a third input adapted to receive a pseudo-random pattern. The multi-phase clock generator provides the secondary clock signals from multiple phases of the dithered clock signal. The system includes a pseudo-random pattern generator which provides the pseudo-random pattern.

22 Claims, 5 Drawing Sheets

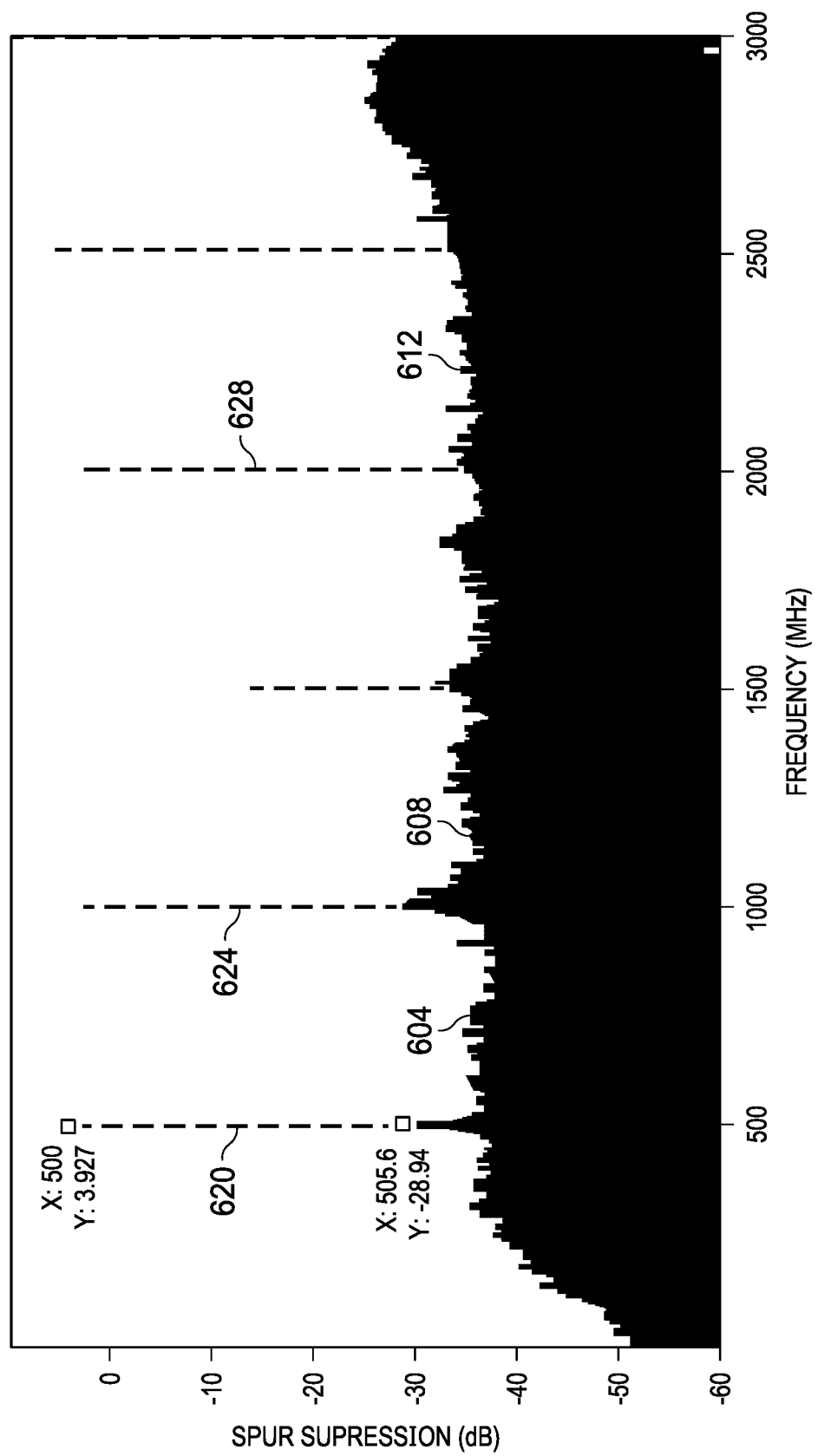

METHODS AND SYSTEMS FOR GENERATION OF BALANCED SECONDARY CLOCKS FROM ROOT CLOCK

CROSS REFERENCE TO RELATED APPLICATIONS

This application claims priority from Indian Provisional Application No. 202141007690, filed Feb. 24, 2021, incorporated herein by reference in its entirety.

BACKGROUND

The disclosure generally relates to generation of balanced secondary clocks from a root clock.

DESCRIPTION OF THE RELATED ART

In RF communication and other mixed signal systems, analog circuitry may operate in the gigahertz (GHz) range while digital circuitry may operate at lower frequencies (e.g., 400-500 MHz) for optimal power efficiency. For example, in a radio base station, a mixer, a phase lock loop, and an up-converter may operate at 3 GHz while a serial data interface and a digital pre-distortion may operate at 500 MHz. Existing systems generally require a number of identical parallel hardware working in unison to derive secondary clocks from a root clock (also called primary clock). In one existing method, the root clock is divided using a clock divider which performs a divide-by-N operation and produces secondary clock signals using rising or falling edges of the root clock signal. The resulting secondary clocks are applied to N number of parallel hardware so that all edges of the root clock are utilized for balanced operation. In another existing method, the root clock is divided by a divide-by-N operation to produce secondary clocks but the number of parallel hardware is not same as the division factor. This leads to an under-utilization of clock edges because not all edges of the root clock are utilized, resulting in digital spurs in the system.

Thus, a drawback of some existing systems is that the number of parallel hardware depends on the division factor as well as the root clock frequency. If the root clock frequency or the division factor changes, the number of parallel hardware must also change. A drawback of other existing systems is that under utilization of all edges of the root clock leads to digital clock spurs which couple to analog circuitry and degrade system performance. For example, periodic activities of digital circuitry at clock edges cause instantaneous surge in current demand which causes a change (e.g., a slight decrease or "dip") in a supply voltage, thereby limiting common mode range of analog circuitry.

SUMMARY

In one aspect, a system for generating secondary clock signals from a primary clock signal includes a dithered clock divider which has a first input adapted to receive the primary clock signal and a second input adapted to receive a random division ratio. The dithered clock divider provides a dithered clock signal. The system includes a multi-phase clock generator which has a first input adapted to receive the primary clock signal, a second input adapted to receive the dithered clock signal, and a third input adapted to receive a pseudo-random pattern. The multi-phase clock generator provides the secondary clock signals from multiple phases of the dithered clock signal. The system includes a pseudo-random pattern generator which has a first input adapted to receive the random division ratio and a second input adapted to receive the dithered clock signal. The pseudo-random pattern generator provides the pseudo-random pattern. The system includes a random division ratio selector which has an input adapted to receive the dithered clock signal and provides the random division ratio.

In an additional aspect, the dithered clock divider divides the primary clock signal into blocks of dithered clock signals responsive to the random division ratio. The pseudo-random pattern indicates edge positions of the secondary clock signals.

In an additional aspect, the secondary clock signals correspond to selected phases of the dithered clock signal.

In an additional aspect, the random division ratio has one of three possible values: N+K, N, N−K, and wherein N is a primary division number and K is a variance.

In an additional aspect, the frequency of the secondary clock signals is equal to the frequency of the dithered clock signal divided by the random division ratio.

In an additional aspect, a method of generating secondary clock signals from a primary clock signal includes generating a random division ratio, and dividing the primary clock signal into blocks of dithered clock signals responsive to the random division ratio. The method includes providing a pseudo-random pattern indicating edge positions of the secondary clock signals, and providing the secondary clock signals from multiple phases of the dithered clock signal responsive to the pseudo-random pattern. The frequency of the dithered clock signal changes in response to a change of the random division ratio.

In an additional aspect, the method includes selecting the first phase of the dithered clock signal as a first secondary clock signal, and selecting the remaining secondary clock signals from the remaining phases of the dithered clock signal based on the pseudo-random pattern.

In an additional aspect, a method of generating secondary clock signals from multiple phases of a primary clock signal includes generating a random division ratio and dividing the primary clock signal into blocks of dithered clock signals responsive to the random division ratio. The method includes providing a pseudo-random pattern indicating edge positions of the secondary clock signals and selecting a first phase of the dithered clock signal as a first secondary clock signal. The method includes selecting remaining secondary clock signals from a subset of the remaining phases of the dithered clock signal based on the pseudo-random pattern.

In an additional aspect, a system for generating secondary clock signals from a primary clock signal includes a dithered clock divider which has a first input adapted to receive the primary clock signal, a second input and a dithered clock signal output. The system includes a random division ratio selector which has an input coupled to the dithered clock signal output and a random division ratio output coupled to the second input of the dithered clock divider. The random division ratio selector outputs a random division ratio in response to the dithered clock signal. The system includes a multi-phase clock generator which has a first input adapted to receive the primary clock signal, a second input coupled to the dithered clock signal output, and a third input. The multi-phase clock generator provides the secondary clock signals from multiple phases of the dithered clock signal. The system includes a pseudo-random pattern generator which has a first input coupled to the random division ratio selector output, a second input coupled to the dithered clock signal output, and a pseudo-random pattern output coupled to the third input of the multi-phase clock generator.

BRIEF DESCRIPTION OF THE DRAWINGS

FIG. 6 is a frequency diagram of a simulated waveform representing frequency spectrum of current drawn by the system.

The same reference numbers or other reference designators are used in the drawings to designate the same or similar (functionally and/or structurally) features.

DETAILED DESCRIPTION

Figure 1:
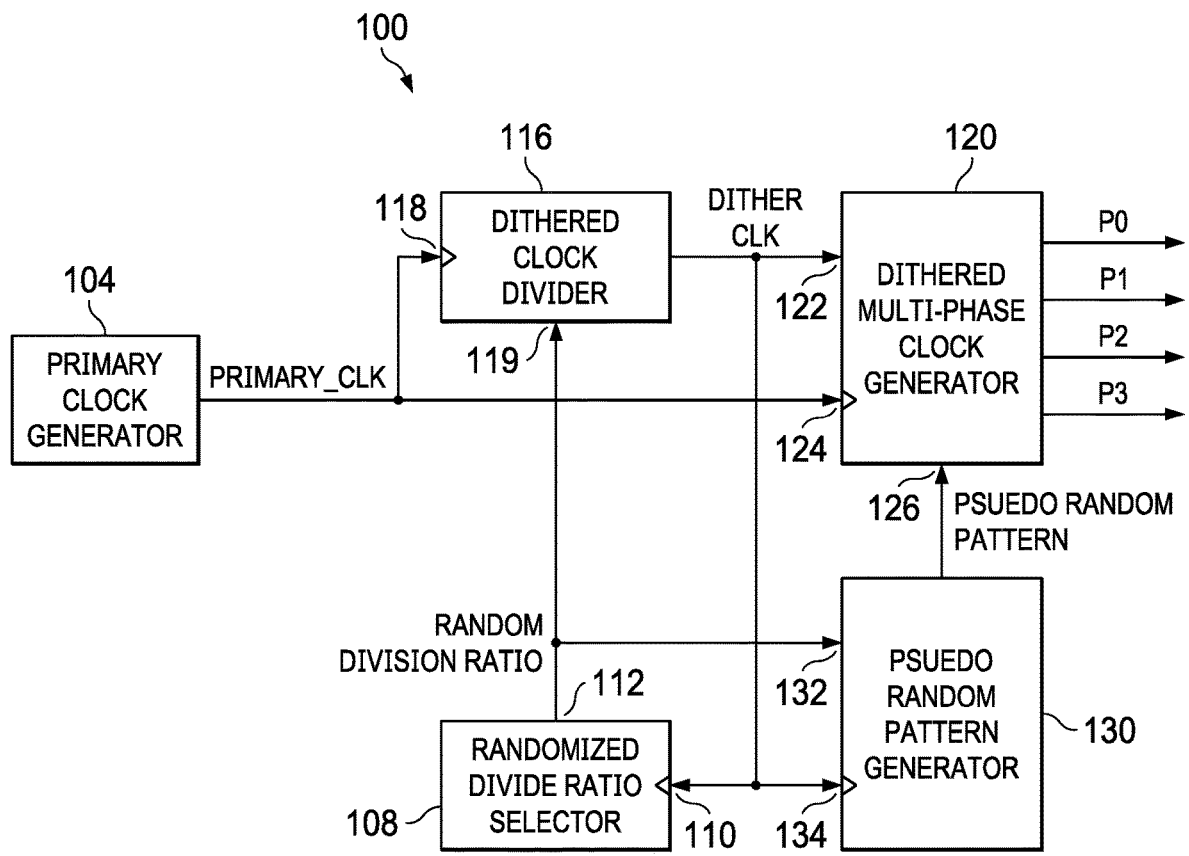
FIG. 1 is a block diagram of a system of an example embodiment.

FIG. 1 is a block diagram of a system 100 of an example embodiment. The system 100 includes a primary clock generator 104 which provides a primary clock signal PRIMARY_CLK. The system 100 derives four secondary clock signals from the primary clock signal PRIMARY_CLK. The phases P0, P1, P2, and P3, which are the four secondary clock signals, are derived from multiple phases of PRIMARY_CLK. The secondary clock signals are also referred simply as different "phases." Thus, the first secondary clock signal may be referred to as P0 phase, the second secondary clock may be referred to as P1 phase, the third secondary clock signal may be referred to as P2 phase, and the fourth secondary clock signal may be referred to as P3 phase. The phases P0, P1, P2, and P3 can be provided as clock signals to four parallel hardware (not shown in FIG. 1).

Although in the example embodiment of FIG. 1, four phases P0, P1, P2, and P3 are derived from the primary clock signal PRIMARY_CLK, the system 100 can be modified to produce any suitable number of phases.

As explained below, because P0, P1, P2, and P3 are randomly separated, they are balanced, and thus periodic activities of digital circuitry that receive P0, P1, P2, and P3 do not occur concurrently. The effect of this is the periodic digital logic operations at clock edges do not create digital spurs which may couple to analog circuitry and degrade system performance. For example, because periodic activities of digital circuitry do not occur concurrently, instantaneous surges in current demand are lessened, which prevents dips in the supply voltage of the system 100.

Figure 2:
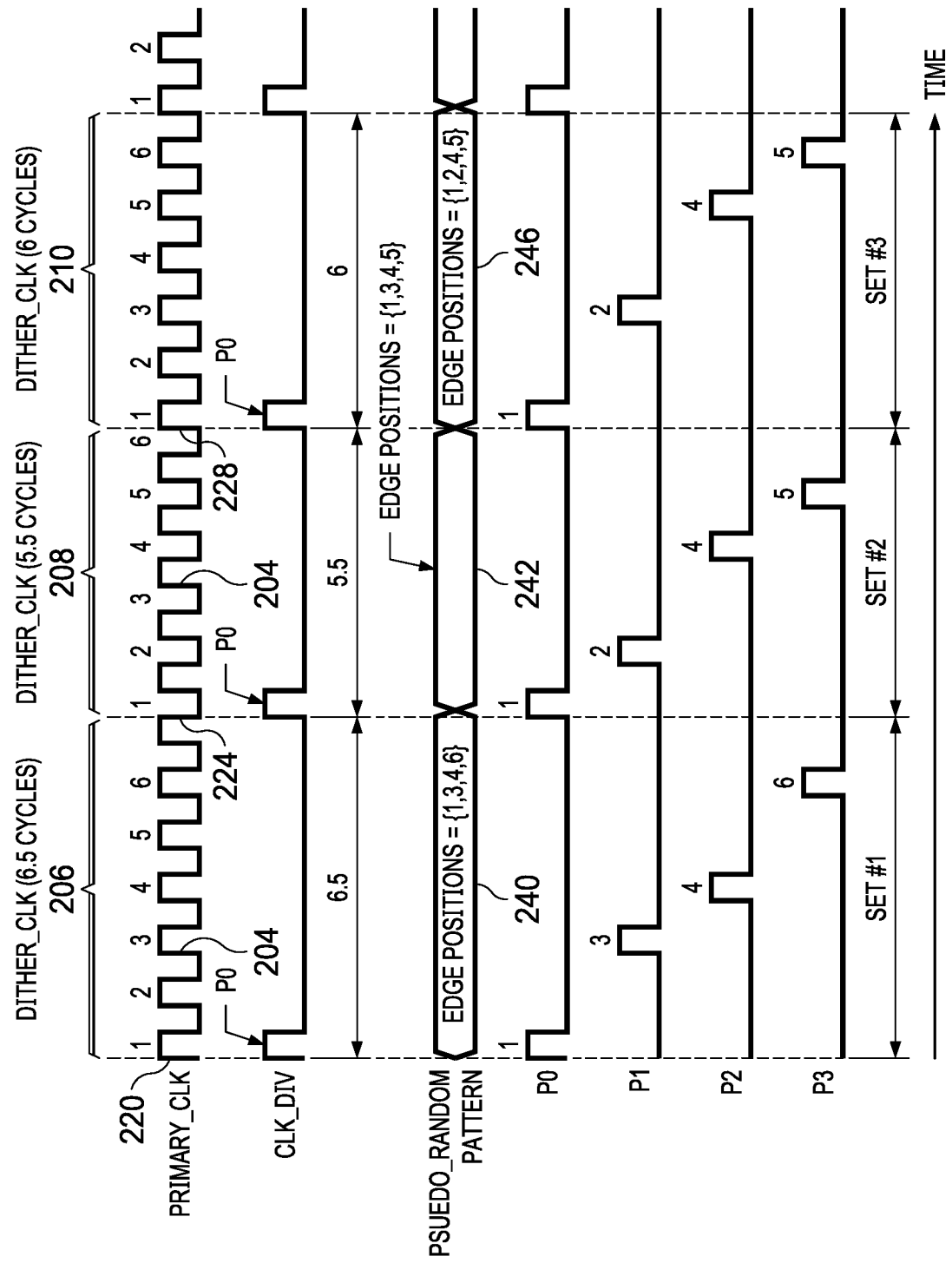
FIG. 2 is a timing diagram illustrating waveforms generated by modules of the system of FIG. 1.

FIG. 2 illustrates waveforms generated by the system 100. The primary clock generator 104 provides the primary clock signal PRIMARY_CLK 204. The system 100 includes a random division ratio selector 108 which has an input 110 coupled to receive a dithered clock signal DITHER_CLK. Dithered clock signals (DITHER_CLKs) are blocks of PRIMARY_CLKs 206, 208, 210, and are explained below. CLK_DIV shows the starting edges of DITHER_CLK and shows the random division ratio. As explained below, the dithered clock signal DITHER_CLK is derived by dividing the primary clock signal PRIMARY_CLK 204 into blocks or sections of dithered clock signals DITHER_CLK. The random division ratio selector 108 provides a random divison ratio at an output 112.

In an example embodiment, the random division ratio may have one of three possible values: N+K, N, N−K, where N is a primary division number, and K is a variance. If, for example, the primary division number N=6 and the variance K=0.5, the random divison ratio may have one of three possible values: 6.5, 6, and 5.5. In an example embodiment, the N and K are chosen based on the frequency of the primary clock signal PRIMARY_CLK and the frequency of the secondary clock signals. In other example embodiments, the random division ratio may have other possible values.

The system 100 includes a dithered clock divider 116 which has a first input 118 coupled to receive the primary clock signal PRIMARY_CLK and a second input 119 coupled to receive the random division ratio. Based on the random division ratio, the dithered clock divider 112 divides the primary clock signal PRIMARY_CLK into blocks or sections of dithered clock signals DITHER_CLK identifying starting edges in each block or section of DITHER_CLK. In FIG. 2, a graph CLK_DIV shows the random division ratios (6.5, 5.5, and 6) used to generate the blocks of DITHER_CLK, and the graph CLK_DIV also shows the starting edges (P0) of each block of DITHER_CLK. The number of cycles or period in the blocks of DITHER_CLK varies depending on the random division ratio. If the random division ratio selector 108 selects 6.5 as the random division ratio, a first block 206 of DITHER_CLK has 6.5 cycles or periods. If the random division ratio selects 5.5 as the next random division ratio, a second block 208 of DITHER_CLK has 5.5 cycles or periods. If, the random division ratio selects 6 as the next random division ration, a third block 210 of DITHER_CLK consists of 6 cycles or periods. Thus, the frequency of the dithered clock signal DITHER_CLK changes in response to a change of the random division ratio.

Depending on the random division ratio selected by the random division ratio selector 108, the starting edge of a block of DITHER_CLK may correspond to a rising edge or a falling edge of a cycle or a period. In FIG. 2, the first block 206 of DITHER_CLK has a starting edge 220 that corresponds to a rising edge of a cycle, the second block 208 of DITHER_CLK has a starting edge 224 that corresponds to a falling edge of a cycle, and the third block 210 has a starting edge 228 that corresponds to a rising edge of a cycle. The starting edges of the blocks of DITHER_CLK define the boundaries of the blocks.

In an example embodiment, the starting edges of a block of DITHER_CLK may be selected as a reference for P0 phase. Thus, starting edges 220, 224, and 228 may, for example, be selected as references for P0 phase.

The system 100 includes a multi-phase clock generator 120 which has a first input 122 coupled to receive the dithered clock signal DITHER_CLK; a second input 124 coupled to receive the primary clock PRIMARY_CLK; and a third input 126 coupled to receive a pseudo-random pattern. The multi-phase clock generator 120 provides P0, P1, P2, and P3 phases. The pseudo-random pattern (e.g. multi-phase edge positions signal) indicates the edge of position of each of the phases P0, P1, P2, and P3. In the example embodiment of FIG. 2, the starting edge of each block of DITHER_CLK is selected as the phase P0, thus maximizing the number of positions available for the phases P1, P2 and P3. With reference to the graph CLK_DIV, the starting edge of each block is indicated as P0. For block 206, a pseudo-random pattern 240 is {1, 3, 4, 6}. Thus, the first, third, fourth and sixth cycles of block 206 are selected by the multi-phase clock generator 120 as the respective P0, P1, P2 and P3 phases from block 206. A pseudo-random pattern 242 for block 208 is {1, 2, 4, 5}. Thus, the first, second, fourth and fifth cycles are selected as the respective P0, P1, P2, and P3 phases from block 208. Finally, for block 210, a pseudo-random pattern 246 is {1, 2, 4, 5}. Thus, the first, second, fourth and fifth periods are selected as the respective P0, P1, P2, and P3 phases from block 210. More detail is provided below with reference to the random pattern generator 130.

The system 100 includes a pseudo-random pattern generator 130 which has a first input 132 coupled to receive the random division ratio and a second input 134 coupled to receive the dithered clock signal DITHER_CLK. The pseudo-random pattern generator 130 provides the pseudo-random pattern which indicates edge positions of the phases P0, P1, P2, and P3. In FIG. 2, the pseudo-random patterns for the blocks 206, 208, and 210 are {1, 3, 4, 6}, {1, 2, 4, 5}, and {1, 2, 4, 5}, respectively. The multi-phase clock generator generates P0, P1, P2, and P3 phases according to the edge positions indicated by the pseudo-random pattern.

As explained above, the frequency of the dithered clock signal changes in response to a change of the random division ratio. However, the average frequency of the dithered clock signal approaches the target frequency because of the average random division ratio over a period of time. Additionally, the pseudo-random pattern dictates the edge positions of the phases (i.e., secondary clock signals). As a result current drawn from the supply due to digital activities at clock edges are not repeated in a pattern, thereby reducing spurs.

The phases P0, P1, P2 and P3 are balanced because they are randomly separated by the pseudo-random pattern. Thus, periodic activities of the digital circuitry that receive the phases P1, P2, P3, and P4 do not occur concurrently. The effect of this is the periodic activities of digital logic operation do not create digital spurs which may couple to analog components and degrade system performance.

Figure 3:
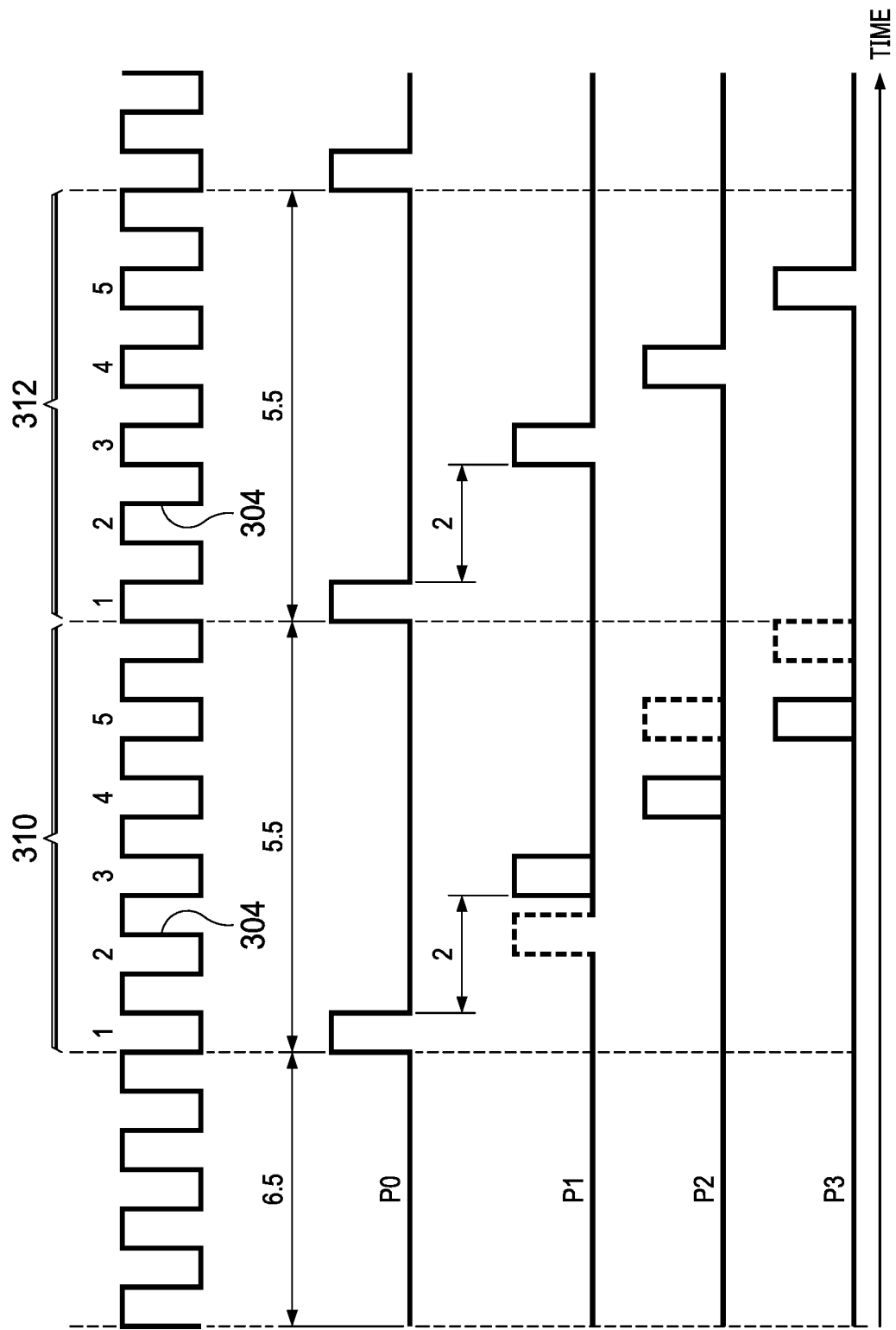
FIG. 3 is a timing diagram illustrating signals with different phases generated from a primary clock signal.

FIG. 3 illustrates waveforms for generation of 500 MHz clock (e.g. P0, P1, P2, and P3 phases) from a 3 GHz primary clock signal 304 (PRIMARY_CLK). With N=6 and K=0.5, the random division ratio has one of three possible values {6.5, 6, 5.5}. In this example, 5.5 is randomly selected as the ratio twice. Thus, the primary clock signal 304 is divided into two blocks 310 and 312 of dithered clocks, each consisting of 5.5 cycles. In this example, the worst case spacing corresponds to a frequency of 3 GHz/5.5.

If there are no design constraints with respect to the phases P0, P1, P2, and P3, there are 6 edges from which 4 edges can be chosen, thus giving 15 possibilities for the random pattern sets (if P0 need not be the starting phase). However, with design constraints, the possibilities for the random pattern sets become limited.

In some example embodiments, due to design requirements, P0 and P2 must not overlap, and P1 and P3 must not overlap. Also, there may be other requirements such as maximizing minimum distance between rising edges of the clocks. For example, P1 can be assigned any one of three positions {2, 3, or 4} in blocks 310 and 312. This will result in a worst case minimum distance (between two consecutive P1s) falling to 3.5 cycles of the primary clock signal. The choices for P0 can be restricted to one of two positions {2, 3}, which will increase the worst case minimum distance (between two consecutive P1s) to 4.5 cycles of the primary clock signal. There are 6 possible patterns that meet the criteria, namely {1, 2, 3, 5}, {1, 2, 3, 6}, {1, 3, 4, 5}, {1, 3, 4, 6}, {1, 2, 4, 5}, {1, 2, 5, 6}. Because the worst case minimum distance of 4.5 cycles occurs if the division factor is 5.5, if the initial division factor is 5.5, the selected pattern is continued.

If the random division ratio changes to 6.5, the blocks of dithered clock will include more cycles. The effect of that is the pseudo-random pattern will have more possible patterns. Also, if P0 phase is allowed to be −0.5 cycle away from the block boundary (i.e., dither clock boundary), the number of possible pseudo-random patterns will increase.

In an example embodiment, the pseudo-random pattern generator 130 generates the pseudo-random pattern based on one or more inputs such as synthesis frequency constraints, and design specific constraints. The synthesis frequency constraints require that the separation between consecutive edges of a secondary clock signal is determined by the maximum clock frequency. A design constraint may require phases $P_0, P_1, P_2 \ldots P_{M-1}$ appear in a fixed order, or may indicate the order of data transfer, thus indicating one or more phases cannot overlap.

In an example embodiment, the pseudo-random pattern generator 130 may utilize a lookup table which stores possible edge positions that are selected randomly based on a random number generated by linear feedback shift registers (LFSR). The possible edge positions may be based on design requirements and constraints and the edge positions may be stored in a lookup table.

Figure 4:
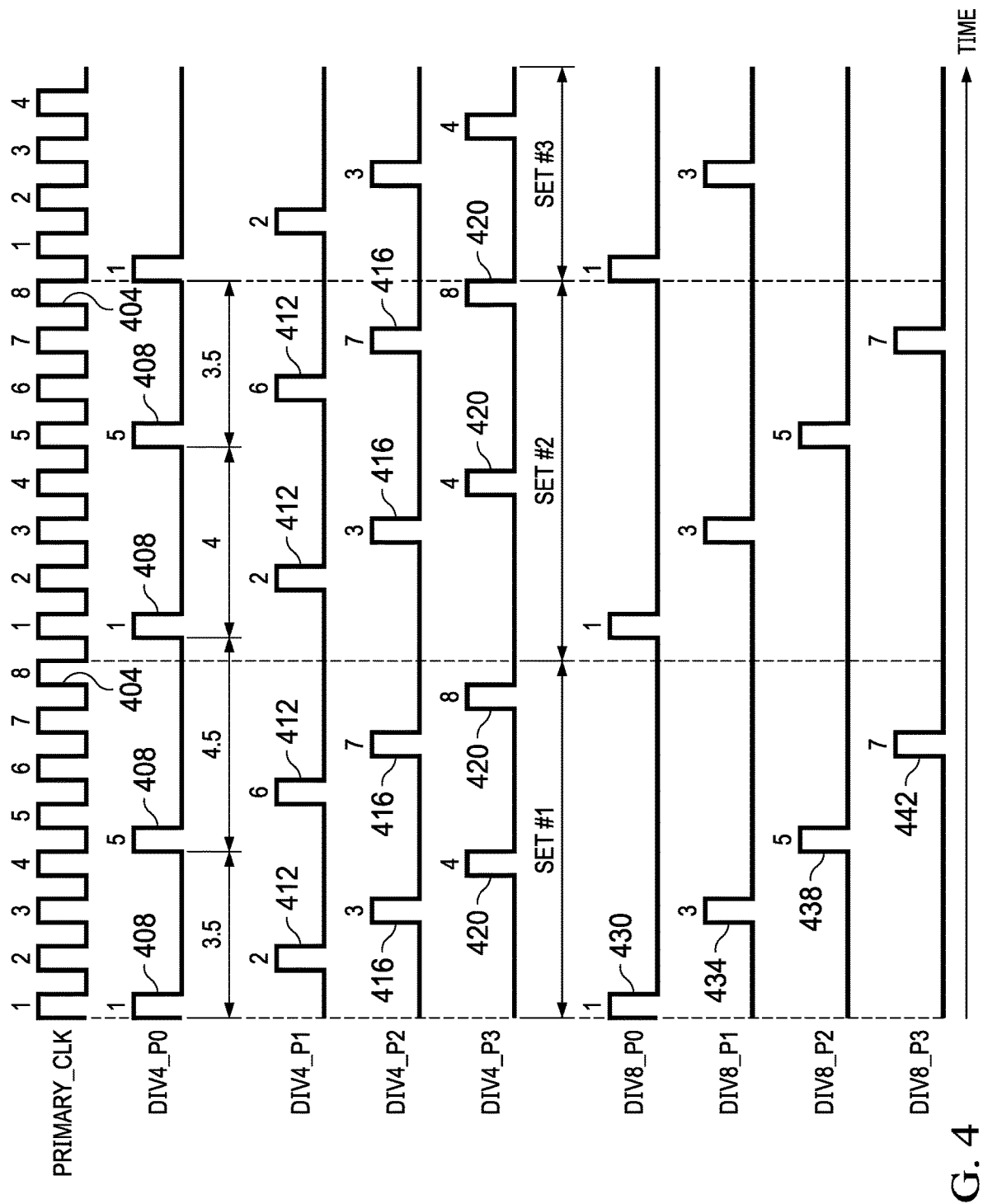
FIG. 4 is a timing diagram illustrating divide-by-four and divide-by-eight clocks.

FIG. 4 shows an example in which the primary clock signal PRIMARY_CLK 404 is divided to derive four phases from every four cycles. In this example, the primary clock signal 404 is divided by random division ratios (3.5, 4.5, 4 and 3.5) to derive four Div4 phases: P0 (408), P1 (412), P2 (416), and P3 (420). In some example embodiments, dithering occurs because of the changing random division ratio. P0 is selected as the starting edge when a change of the random division ratio occurs, P1 can be selected from {2, 3}, P2 from {4, 5}, and P3 from {6, 7}. Next, from each eight set of Div4 phases, four pulses are randomly selected to derive Div8 phases: P0 (430), P1 (434), P2 (438), and P3 (442). This ensures all edges of the primary clock are equally chosen among 4 phases of the Div8 and also ensures a deterministic relationship between Div4 phases and Div8 phases. In the example of FIG. 4, in set #1, the first, third, fifth and seventh pulses are selected to derive the four Div8 phases, and in set #2, the first, third, fifth, and seventh pulses are selected to derive the next four Div8 phases. In another example (not shown in FIG. 4), in set #1, the first, third, fifth and seventh pulses can be selected to derive the four Div8 phases, and in set #2, the first, second, fourth, and seventh pulses can be selected to derive the next four Div8 phases. Because a tertiary clock (Div8) is derived by randomly selecting pulses from a secondary clock (Div4), spur level is reduced. In another example embodiment, Div8 phases can be randomly selected between two successive Div4 pulses. For example, Div8 P0 can be selected from Div4 pulses numbered 1 or 2, Div8 P1 can be selected from Div4 pulses numbered 3 or 4, Div8 P2 can be selected from Div4 pulses numbered 5 or 6, and Div8 P3 can be selected from Div4 pulses numbered 7 or 8. (Comment: Please note that in this example, there are two stages of randomization which reduce spur. The secondary clock is derived by using a random division pattern, and then the tertiary clock is derived by randomly selecting pulses from the secondary clock)

In an example embodiment, M phases are generated for a divide-by-N of the root clock (PRIMARY_CLK). In some example embodiment, one of the M phases is generated (e.g. phase P0) as constrained by the randomized divisions of (N−k, N, N+k) where k is a multiple of 0.5. For example if P0 is the reference, divide the block of N clock edges into overlapping M−1 sections. For each of the remaining M−1 phases, randomly select one clock edge in the corresponding section.

Figure 5:
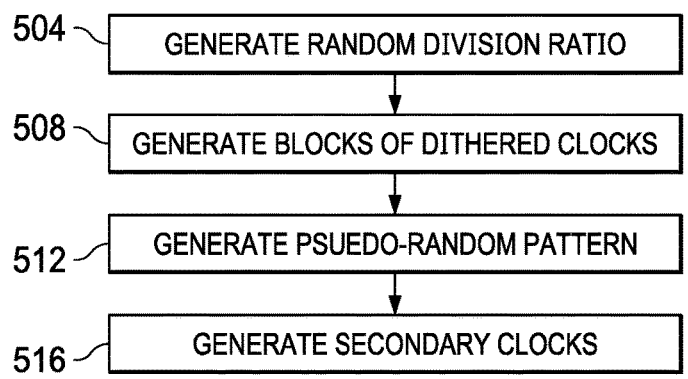
FIG. 5 is a flow diagram of a process of an example embodiment.

FIG. 5 is a flow diagram of a process 500 of generating secondary clock signals from a primary clock signal according to an example embodiment. In block 504, a random division ratio is generated. The random division ratio can be based on the frequency of the primary clock signal and the frequency of the secondary clock signals. In an example embodiment, the random division ratio has one of three possible values: N+K, N, N−K, where N is the primary division number and K is the variance. As discussed above with reference to the example embodiment illustrated in FIG. 1, the random division ratio may be generated by random division ratio selector 108.

In block 508, the primary clock signal is divided into blocks of dithered clock signals based on the random division ratio. The dithered blocks identify starting edges in each block and the number of cycles or period in the blocks varies depending on the random division ratio. As discussed above with reference to the example embodiment illustrated in FIG. 1, the blocks of dithered clock signals are generated by dithered clock divider 116.

In block 512, a pseudo-random pattern is generated indicating edge positions of the secondary clock signals. The phase relationships among the secondary clock signals are defined by the pseudo-random pattern. As discussed above with reference to the example embodiment illustrated in FIG. 1, the pseudo-random pattern (e.g. multi-phase edge positions) is generated by pseudo random pattern generator 130.

In a block 516, the secondary clock signals are provided from multiple phases of the dithered clock signal responsive to the pseudo-random pattern. As discussed above with reference to the example embodiment illustrated in FIG. 1, the secondary clock signals (e.g. P0, P1, P2 . . . $P_{M-1}$) are generated by the dithered multi-phase clock generator 120.

FIG. 6 shows a superimposed waveforms comparing a frequency spectrum of current drawn by the system 100 (shown as reference numbers 604, 608, 612) with balanced multi phase clocks and a frequency sprectrum of systems without balanced multi-phase clocks (shown as reference numbers 620, 624, 628. In this example, a primary clock signal is divided by 6 to derive 6 secondary clocks. The x-axis represents frequency (MHz) and the y-axis represents relative presence of each frequency (dB) with respect to single phase of a divide-by-6 clock. Because the system 100 utilizes dithered clock, energy is distributed across frequencies, resulting in spur reduction. In the example of FIG. 6, spur is reduced by approximately 25 dB, which resulted in a 14% reduction in area required to implement digital circuitry, as compared to solutions where 6 identical parallel hardware are used to achieve balancing. This resulted in approximately 40 mW reduction in power consumption.

In an alternative embodiment, a non-transitory computer-readable medium having program code recorded thereon includes: program code to generate a random division ratio; program code to divide the primary clock signal into blocks of dithered clock signals responsive to the random division ratio; program code to generate a pseudo-random pattern indicating edge positions of the secondary clock signals; and program code to provide the secondary clock signals from multiple phases of the dithered clock signal responsive to the pseudo-random pattern. The phase relationships among the secondary clock signals are defined by the pseudo-random pattern. The random division ratio has one of three values: N+K, N, N−K, and wherein N is a primary division number and K is a variance. In other embodiments, the random division ratio can have other possible values.

In this description, the term "couple" may cover connections, communications, or signal paths that enable a functional relationship consistent with this description. For example, if device A provides a signal to control device B to perform an action, then: (a) in a first example, device A is coupled to device B; or (b) in a second example, device A is coupled to device B through intervening component C if intervening component C does not substantially alter the functional relationship between device A and device B, such that device B is controlled by device A via the control signal provided by device A. Also, in this description, a device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof. Furthermore, in this description, a circuit or device that includes certain components may instead be adapted to be coupled to those components to form the described circuitry or device. For example, a structure described as including one or more semiconductor elements (such as transistors), one or more passive elements (such as resistors, capacitors and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, such as by an end-user and/or a third party.

As used herein, the terms "terminal", "node", "interconnection" and "pin" are used interchangeably. Unless specifically stated to the contrary, these terms are generally used to mean an interconnection between or a terminus of a device element, a circuit element, an integrated circuit, a device or other electronics or semiconductor component.

While certain components may be described herein as being of a particular process technology, these components may be exchanged for components of other process technologies. Circuits described herein are reconfigurable to include the replaced components to provide functionality at least partially similar to functionality available before the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitors, respectively, coupled in series or in parallel between the same two nodes as the single resistor or capacitor. Also, uses of the phrase "ground terminal" in this description include a chassis ground, an Earth ground, a floating ground, a virtual ground, a digital ground, a common ground, and/or any other form of ground connection applicable to, or suitable for, the teachings of this description. Unless otherwise stated, "about", "approximately", or "substantially" preceding a value means+/−10 percent of the stated value.

Modifications are possible in the described embodiments, and other embodiments are possible, within the scope of the claims.

What is claimed is:

1. A system for generating secondary clock signals from a primary clock signal, comprising:

a dithered clock divider having a first input adapted to receive the primary clock signal and a second input, the dithered clock divider having a dithered clock signal output;

a random division ratio selector having an input coupled to the dithered clock signal output and a random division ratio output coupled to the second input of the dithered clock divider, the random division ratio selector operable to output a random division ratio in response to the dithered clock signal;

a multi-phase clock generator having a first input adapted to receive the primary clock signal, a second input coupled to the dithered clock signal output, and a third input, the multi-phase clock generator operable to provide the secondary clock signals from multiple phases of the dithered clock signal; and a pseudo-random pattern generator having a first input coupled to the random division ratio selector output, a second input coupled to the dithered clock signal output, and a pseudo-random pattern output coupled to the third input of the multi-phase clock generator.

2. The system of claim 1, wherein the dithered clock divider is operable to divide the primary clock signal into blocks of dithered clock signals responsive to the random division ratio.

3. The system of claim 1, wherein the pseudo-random pattern generator is operable to provide a pseudo-random pattern at the pseudo-random pattern output, and wherein the pseudo-random pattern indicates edge positions of the secondary clock signals.

4. The system of claim 1, wherein the pseudo-random pattern generator is operable to provide a pseudo-random pattern defining phase relationships among the secondary clock signals.

5. The system of claim 1, wherein the secondary clock signals correspond to selected phases of the dithered clock signal.

6. The system of claim 1, wherein the random division ratio has one of three possible values: N+K, N, N−K, and wherein N is a primary division number and K is a variance.

7. The system of claim 1, wherein the frequency of the secondary clock signals is equal to the frequency of the dithered clock signal divided by the random division ratio.

8. A method of generating secondary clock signals from a primary clock signal, comprising:
generating a random division ratio;
dividing the primary clock signal into blocks of dithered clock signals responsive to the random division ratio;
providing a pseudo-random pattern indicating edge positions of the secondary clock signals; and
providing the secondary clock signals from multiple phases of the dithered clock signal responsive to the pseudo-random pattern.

9. The method of claim 8, wherein the random division ratio has one of three possible values: N+K, N, N−K, and wherein N is a primary division number and K is a variance.

10. The method of claim 8, wherein the frequency of the secondary clock signals is equal to the frequency of the dithered clock signal divided by the random division ratio.

11. The method of claim 8, wherein the frequency of the dithered clock signal changes in response to a change of the random division ratio.

12. The method of claim 8, wherein phase relationships among the secondary clock signals are defined by the pseudo-random pattern.

13. The method of claim 8, wherein the secondary clock signals correspond to phases of the dithered clock signal.

14. The method of claim 8, further comprising:
selecting the first phase of the dithered clock signal as a first secondary clock signal; and
selecting the remaining secondary clock signals from the remaining phases of the dithered clock signal based on the pseudo-random pattern.

15. The method of claim 8, wherein the pseudo-random pattern is generated based on design constraints.

16. A method of generating secondary clock signals from multiple phases of a primary clock signal, comprising:
generating a random division ratio;
dividing the primary clock signal into blocks of dithered clock signals responsive to the random division ratio;
providing a pseudo-random pattern indicating edge positions of the secondary clock signals;
selecting a first phase of the dithered clock signal as a first secondary clock signal; and
selecting remaining secondary clock signals from a subset of the remaining phases of the dithered clock signal based on the pseudo-random pattern.

17. The method of claim 16, wherein phase relationships among the secondary clock signals are defined by the pseudo-random pattern.

18. The method of claim 16, wherein the random division ratio has one of three values: N+K, N, N−K, and wherein N is a primary division number and K is a variance.

19. The method of claim 16, wherein the frequency of the secondary clock signals is equal to the frequency of the dithered clock signal divided by the random division ratio.

20. A non-transitory computer-readable medium having program code stored therein, the non-transistor computer-readable medium including:
program code to generate a random division ratio;
program code to divide the primary clock signal into blocks of dithered clock signals responsive to the random division ratio;
program code to generate a pseudo-random pattern indicating edge positions of the secondary clock signals; and
program code to provide the secondary clock signals from multiple phases of the dithered clock signal responsive to the pseudo-random pattern.

21. The non-transitory computer-readable medium of claim 20, wherein phase relationships among the secondary clock signals are defined by the pseudo-random pattern.

22. The non-transitory computer-readable medium of claim 20, wherein the random division ratio has one of three values: N+K, N, N−K, and wherein N is a primary division number and K is a variance.

* * * * *